(12) United States Patent
Aichinger et al.

(10) Patent No.: US 12,294,018 B2
(45) Date of Patent: May 6, 2025

(54) VERTICAL POWER SEMICONDUCTOR DEVICE INCLUDING SILICON CARBIDE (SIC) SEMICONDUCTOR BODY

(71) Applicant: Infineon Technologies AG, Neubiberg (DE)

(72) Inventors: Thomas Aichinger, Faak am See (AT); Dethard Peters, Höchstadt (DE); Michael Hell, Erlangen (DE); Andreas Hürner, Heroldsberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/827,272

(22) Filed: Sep. 6, 2024

(65) Prior Publication Data
US 2025/0089323 A1    Mar. 13, 2025

(30) Foreign Application Priority Data
Sep. 7, 2023 (DE) .......................... 102023124154.0

(51) Int. Cl.
| | |
|---|---|
| H01L 29/16 | (2006.01) |
| H01L 29/43 | (2006.01) |
| H01L 29/51 | (2006.01) |
| H01L 29/78 | (2006.01) |

(52) U.S. Cl.
CPC ........ *H01L 29/1608* (2013.01); *H01L 29/435* (2013.01); *H01L 29/518* (2013.01); *H01L 29/7813* (2013.01)

(58) Field of Classification Search
CPC . H01L 29/1608; H01L 29/435; H01L 29/518; H01L 29/7813
USPC ........................................................... 257/77
See application file for complete search history.

(56) References Cited

U.S. PATENT DOCUMENTS

2023/0352520 A1* 11/2023 Aichinger ........... H01L 29/0623
2024/0405092 A1* 12/2024 Tilke .................... H01L 29/4236

FOREIGN PATENT DOCUMENTS

| | | |
|---|---|---|
| DE | 102020121771 A1 | 2/2022 |
| DE | 102023003690 A | 1/2024 |

* cited by examiner

*Primary Examiner* — Igwe U Anya
(74) *Attorney, Agent, or Firm* — Cooper Legal Group LLC

(57) ABSTRACT

A power semiconductor device is proposed. The vertical power semiconductor device includes a silicon carbide (SiC) semiconductor body having a first surface and a second surface opposite to the first surface. The SiC semiconductor body includes a transistor cell area comprising gate structures, a gate pad area, and an interconnection area electrically coupling a gate electrode of the gate structures and a gate pad of the gate pad area via a gate interconnection. The vertical power semiconductor device further includes a source or emitter electrode. The vertical power semiconductor device further includes a first interlayer dielectric comprising a first interface to the source or emitter electrode and a second interface to at least one of the gate electrode, or the gate interconnection, or the gate pad, and wherein a conduction band offset at the first interface ranges from 1 eV to 2.5 eV.

18 Claims, 3 Drawing Sheets

VERTICAL POWER SEMICONDUCTOR DEVICE INCLUDING SILICON CARBIDE (SIC) SEMICONDUCTOR BODY

RELATED APPLICATION

This application claims priority to German Patent Application No. 102023124154.0, filed on Sep. 7, 2023, entitled "VERTICAL POWER SEMICONDUCTOR DEVICE INCLUDING SIC SEMICONDUCTOR BODY", which is incorporated by reference herein in its entirety.

TECHNICAL FIELD

The present disclosure is related to a vertical power semiconductor device, in particular to a vertical power semiconductor device including a silicon carbide (SiC) semiconductor body.

BACKGROUND

Technology development of new generations of silicon carbide (SiC) power semiconductor devices, e.g. insulated gate field effect transistors (IGFETs) such as metal oxide semiconductor field effect transistors (MOSFETs) or insulated gate bipolar transistors (IGBTs), aims at improving electric device characteristics such as the short-circuit withstand time. A variety of tradeoffs and challenges have to be met when improving the short-circuit withstand time of a SiC power semiconductor device.

There is a need for improving the short-circuit current capability of SiC power semiconductor devices.

SUMMARY

An example of the present disclosure relates to a vertical power semiconductor device. The vertical power semiconductor device includes a silicon carbide (SiC) semiconductor body having a first surface and a second surface opposite to the first surface. The SiC semiconductor body includes a transistor cell area comprising gate structures, a gate pad area, and an interconnection area electrically coupling a gate electrode of the gate structures and a gate pad of the gate pad area via a gate interconnection. The power semiconductor device further includes a source or emitter electrode. The power semiconductor device further includes a first interlayer dielectric comprising a first interface to the source or emitter electrode and a second interface to at least one of the gate electrode, or the gate interconnection, or the gate pad. A value of a conduction band offset at the first interface ranges from 1 eV to 2.5 eV.

Another example of the present disclosure relates to a vertical power semiconductor device. The vertical power semiconductor device includes a silicon carbide, SiC, semiconductor body having a first surface and a second surface opposite to the first surface. The SiC semiconductor body includes a transistor cell area comprising gate structures, a gate pad area, and an interconnection area electrically coupling a gate electrode of the gate structures and a gate pad of the gate pad area via a gate interconnection. The power semiconductor device further includes a source or emitter electrode. The power semiconductor device further includes a first interlayer dielectric comprising a first interface to the source or emitter electrode and a second interface to at least one of the gate electrode, or the gate interconnection, or the gate pad. A value of a valence band offset at the second interface ranges from 1.0 eV to 2.5 eV.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of silicon carbide (SiC) power semiconductor devices and together with the description serve to explain principles of the embodiments. Further embodiments are described in the following detailed description and the claims.

DETAILED DESCRIPTION

Figure 1:
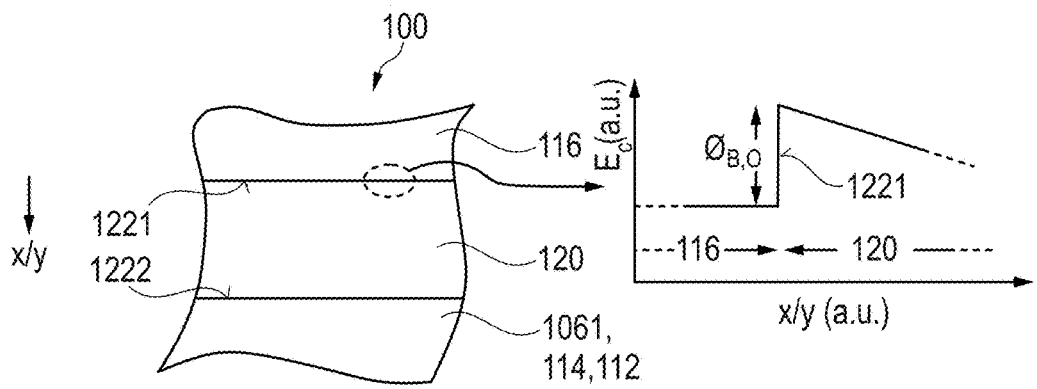
FIG. 1 schematically and exemplarily shows a view of a configuration example of a SiC power semiconductor device including a first interlayer dielectric comprising a first interface to a source or emitter electrode and a second interface to a gate electrode or a gate interconnection or a gate pad.

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" may describe a permanent low-resistive connection between electrically connected elements, for example a direct contact between the concerned elements or a low-resistive connection via a metal and/or heavily doped semiconductor material. The term "electrically coupled" may include that one or more intervening element(s) adapted for signal and/or power transmission may be connected between the electrically coupled elements, for example, elements that are controllable to temporarily provide a low-resistive connection in a first state and a high-resistive electric decoupling in a second state.

If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

A configuration example of a vertical power semiconductor device includes a silicon carbide, SiC, semiconductor body having a first surface and a second surface opposite to the first surface. The SiC semiconductor body includes a transistor cell area comprising gate structures, a gate pad area, and an interconnection area electrically coupling a gate electrode of the gate structures and a gate pad of the gate pad area via a gate interconnection. The vertical power semiconductor device further includes a source or emitter electrode. The power semiconductor device further includes a first interlayer dielectric comprising a first interface to the source or emitter electrode and a second interface to at least one of the gate electrode, or the gate interconnection, or the gate pad. A value of a conduction band offset at the first interface may range from 1 eV to 2.5 eV, or from 1.5 eV to 2.1 eV.

The power semiconductor device may be part of an integrated circuit or may be a discrete semiconductor device or a semiconductor module, for example. The power semiconductor device may be or may include an insulated gate field effect transistor (IGFET) such as a metal oxide semiconductor field effect transistor (MOSFET) or an insulated gate bipolar transistor (IGBT), for example. The power semiconductor device may be a vertical power semiconductor device having a load current flow between the first surface and the second surface opposite to the first surface. The vertical power semiconductor device may be configured to conduct currents of more than 1A, or more than 10 A, or more than 30 A, or more than 50A, or more than 75 A, or even more than 100A, and may be further configured to block voltages between load electrodes, e.g. between collector and emitter on an IGBT, or between drain and source of a MOSFET, in the range of several hundreds of up to several thousands of volts, e.g. 400V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the power semiconductor device, for example.

The power semiconductor device may be based on a semiconductor body from a crystalline SiC semiconductor material having a band gap larger than the band gap of silicon, i.e. larger than 1.12 eV. For example, the semiconductor material may be 2H-SiC (SiC of the 2H polytype), 6H-SIC or 15R-SiC. According to an example, the semiconductor material is silicon carbide of the 4H polytype (4H-SiC). The semiconductor body may include or consist of a semiconductor substrate having none, one or more than one semiconductor layers, e.g. epitaxially grown layers, thereon.

The first surface may be a front surface or a top surface of the semiconductor body, and the second surface may be a back surface or a rear surface of the semiconductor body, for example. The semiconductor body may be attached to a lead frame via the second surface, for example. Over the first surface of the semiconductor body, bond pads may be arranged and bond wires may be bonded on the bond pads, for example.

For realizing a desired current carrying capacity, the vertical SiC power semiconductor device may be designed by a plurality of parallel-connected transistor cells. The parallel-connected transistor cells may, for example, be transistor cells formed in the shape of a strip or a strip segment. Of course, the transistor cells can also have any other shape, e.g. circular, elliptical, polygonal such as hexagonal or octahedral. The transistor cells are arranged in the transistor cell area of the SiC semiconductor body. The transistor cell area may be an active area where an emitter region of an IGBT (or a source region of a MOSFET) and a collector region of an IGBT (or a drain region of a MOSFET) are arranged opposite to one another along the vertical direction. In the active area, a load current may enter or exit the semiconductor body of the power semiconductor device, e.g. via contact plugs on the first surface of the SiC semiconductor body. The power semiconductor device may further include an edge termination area that may include a termination structure. In a blocking mode or in a reverse biased mode of the power semiconductor device, the blocking voltage between the transistor cell area and a field-free region laterally drops across the termination structure. The termination structure may have a higher or a slightly lower voltage blocking capability than the transistor cell area. The termination structure may include a junction termination extension (JTE) with or without a variation of lateral doping (VLD), one or more laterally separated guard rings, or any combination thereof, for example.

For example, the gate structures may be planar gate structures, or may be a trench gate structures. The gate structures may be the stripe-shaped. The gate structures may also have another layout or geometry in a plan view, e.g. hexagonal, square, circular, elliptic. The gate electrode of the gate structures may be electrically connected to the gate pad in the gate pad area via the gate interconnection, for example. The gate interconnection or a part thereof may be arranged outside of the transistor cell area, for example in an interconnection area arranged laterally between the transistor cell area and the edge termination area. The gate interconnection may include one or more conductive material(s), e.g. metal, metal alloys, e.g. Cu, Au, AlCu, Ag, or alloys thereof, metal compounds, e.g. TiN, highly doped semiconductor material such as highly doped polycrystalline silicon. The one or more conductive materials may form a layer stack, for example. At least part of the gate interconnection may be a so-called gate runner that merges with the gate pad. The gate pad and, for example, a first load electrode pad, e.g. a source pad of a MOSFET or an emitter pad of an IGBT, may be part of a wiring area over the SiC semiconductor body. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric structure may be arranged. Contact plug(s) and/or contact line(s) may be formed in openings of the interlayer dielectric structure to electrically connect parts, e.g. metal lines or contact areas, of different wiring levels to one another. The source or emitter electrode may include one or more parts, e.g. the source or emitter pad, a source or emitter line (or source or emitter pad runner) in the interconnection area, a source or emitter trench filling material, e.g. n-doped polycrystalline silicon, in a trench structure below the gate pad, for example. The one or more parts of the source or emitter electrode are electrically connected and may be formed by different, partly different or same conductive materials. For example, the source pad or emitter pad of the source or emitter electrode and/or the source or emitter line may be formed by one or more metal or metal alloys, and the source or emitter trench filling material below the gate pad may be formed by doped polycrystalline silicon such as highly doped n-type polycrystalline silicon, for example.

The first interlayer dielectric may be arranged in at least one of the transistor cell area, e.g. directly above the gate electrode and directly below the source or emitter electrode, in the gate interconnection area, e.g. laterally between gate interconnection such as a gate runner and the source or emitter line of the source or emitter electrode, in the gate pad area, e.g. directly above the source or emitter trench filling material of the source or emitter electrode and directly below the gate pad. Thus, the first interface and the second interface of the first dielectric layer may face one another in at least one of the transistor cell area, the interconnection area, or the gate pad area.

For example, materials of the source or emitter electrode at the first interface, gate electrode and/or gate pad and/or gate interconnection at the second interface, first interlayer dielectric between the first and second interface, and gate dielectric between the gate electrode and the SiC semiconductor body may be chosen so that at normal operation temperatures, e.g. smaller than 250° C. and at nominal positive gate voltages, e.g. 18V, the first interlayer dielectric is electrically isolating the gate electrode from the source or emitter electrode and the gate dielectric is electrically isolating the gate electrode from the SiC semiconductor body. For this case the overall gate-to-source leakage may be small, e.g. in or below the µA range. However, at higher temperatures, e.g. in case of a short circuit event, the conduction band offset at the first interface in the configuration examples described herein, allows for a much higher thermal leakage current flowing between i) the gate electrode (and/or the gate pad, and/or the gate interconnection) and the source or emitter electrode than between ii) the gate electrode and the SiC semiconductor body. The leakage current through the first interlayer dielectric at high temperatures can be in general the sum of an electron current from the source or emitter electrode into the gate electrode (and/or the gate pad, and/or the gate interconnection) and a hole current from the gate electrode (and/or the gate pad, and/or the gate interconnection) into the source or emitter electrode. Typically, either the electron or the hole current is dominating depending on the respective band-offsets.

Once exceeding a certain critical temperature, the increasing leakage current between the gate electrode (and/or the gate pad, and/or the gate interconnection) and the source or emitter electrode may lead to a reduction of the gate potential in the transistor cell area, thereby reducing the channel overdrive (gate-to-source voltage VGS minus threshold voltage VTH). This results in a self-limiting mechanism of the saturation current. The configuration examples described herein for reducing the channel overdrive operate similar to a thermally sensitive resistor (thermistor) with a negative temperature coefficient (NTC). It can be either incorporated directly in the transistor cell area where the source or emitter electrode is placed directly on top of the first interlayer dielectric that electrically isolates the gate electrode, and/or in distinct inactive device regions, e.g. between metallic source or emitter and gate runners (or interconnection lines) or between the gate pad and a source or emitter trench filling material below the gate pad in the gate pad area. In the configuration examples described herein including the first interlayer dielectric with a low conduction band offset (to the source or emitter electrode) compared to the conduction band offset of the gate dielectric (to the SiC semiconductor body), the original transistor cell area design, e.g. MOS system, that governs the channel properties does not need to be modified to achieve the desired functionality because the material of the gate dielectric is less relevant for achieving the technical effect of reducing the channel overdrive in view of the leakage current flowing through the first interlayer dielectric. Thus, the configuration examples described herein may allow for increasing the short circuit ruggedness without affection of the area-specific on-state resistance, RonxA, of the vertical power semiconductor device.

For example, a portion of the source or emitter electrode at the first interface may be made of aluminum, copper, titanium, nickel, molybdenum, tungsten, or alloys thereof.

For example, a portion of the first interlayer dielectric at the first interface may be made of a high-k material.

For example, the high-k material may be an oxide of aluminum, an oxide of zirconium, a nitride of aluminum, an oxide of hafnium, an oxide of yttrium, an oxide of silicon nitride, silicon nitride, or aluminum nitride. The first interlayer dielectric may also include a layer stack of the above high-k materials, for example.

For example, the gate structures may include a gate dielectric arranged between the gate electrode and the SiC semiconductor body. A portion of the gate dielectric at a channel interface to the SiC semiconductor body may be high-k dielectric. In some other examples, a portion of the gate dielectric at a channel interface to the SiC semiconductor body may be an oxide, e.g. a thermal oxide such as thermal $SiO_2$ or a deposited and annealed oxide. The portion of the gate dielectric may also include a layer stack of dielectric materials, e.g. a combination of an oxide and a high-k material.

For example, the conduction band offset at the first interface of the first interlayer dielectric may be smaller than a conduction band offset at the channel interface. Thus, at a positive gate voltage (on-state) the onset of a thermionic electron tunneling current between the source or emitter electrode and the gate electrode occurs at a (much) lower threshold temperature compared to the onset of a thermionic tunneling current between gate electrode and the SiC semiconductor body. Thereby, the MOS interface and the gate oxide is not altered or degraded due to a large leakage current flowing from the gate electrode though the gate oxide into the semiconductor body.

For example, the gate structures may be planar or trench gate structures. At least a part of the second interface may be arranged in the transistor cell area. The part of the second interface may be directly opposite to, i.e. facing, the first interface.

For example, at least a part of the second interface is arranged in the interconnection area. The part of the second interface may be directly opposite to the first interface.

For example, the part of the second interface may be arranged directly opposite to a part of the source or emitter electrode having two edges at a bottom side that turn into one another at an angle equal to or smaller than 90°. This may allow for locally enhancing the electric field strength at or around the interface between the source or emitter electrode and the interlayer dielectric. Thereby, the thermally-assisted electron tunneling current between source or emitter electrode and the gate electrode may be even further increased in this area.

For example, at least a part of the second interface of the first interlayer dielectric may be arranged in the interconnection area. The part of the second interface may be directly opposite to the first interface along a first lateral direction. A part of the first interlayer dielectric may be arranged laterally between a source or emitter line of the source or emitter electrode and the gate interconnection. Once exceeding a certain critical temperature, the increasing leakage current flowing along the first lateral direction between the gate interconnection and the source or emitter electrode may thus lead to a reduction of the gate potential in the transistor cell area, thereby reducing the channel overdrive.

For example, the gate interconnection may include a gate resistor having a gate resistance in the range from 5Ω to 20Ω.

For example, the vertical power semiconductor device may further include a second interlayer dielectric comprising a first interface to the source or emitter electrode and a second interface to at least one of the gate electrode or the gate interconnection. A conduction band offset at the first interface of the second interlayer dielectric may be larger than the conduction band offset at the first interface of the first interlayer dielectric.

For example, the second interlayer dielectric may be or may include an oxide of silicon. The oxide of silicon may include deposited $SiO_2$ and/or thermal $SiO_2$, for example. In addition or as an alternative, the second interlayer dielectric may be or may include a silicate glass, e.g. tetraethyl orthosilicate (TEOS), for example.

For example, the conduction band offset at the first interface of the second interlayer dielectric may be by 0.5 eV to 1.5 eV larger than the conduction band offset at the first interface of the first interlayer dielectric. Thereby, when exceeding a certain critical temperature, the increasing electron leakage current flow is limited through the first interlayer dielectric.

Another configuration example of a vertical power semiconductor device includes a silicon carbide, SiC, semiconductor body having a first surface and a second surface opposite to the first surface. The SiC semiconductor body includes a transistor cell area comprising gate structures, a gate pad area, and an interconnection area electrically coupling a gate electrode of the gate structures and a gate pad of the gate pad area via a gate interconnection. The vertical power semiconductor device further includes a source or emitter electrode. The vertical power semiconductor device further includes a first interlayer dielectric comprising a first interface to the source or emitter electrode and a second interface to at least one of the gate electrode, or the gate interconnection, or the gate pad. A value of a valence band offset at the second interface may range from 1.0 eV to 2.5 eV, or from 1.5 eV to 2.1 eV. Once exceeding a certain critical temperature, the increasing hole leakage current between the gate electrode (and/or the gate pad and/or the gate interconnection) and the source or emitter electrode may lead to a reduction of the gate potential in the transistor cell area, thereby reducing the channel overdrive.

For example, the vertical power semiconductor device may further include a second interlayer dielectric comprising a first interface to the source or emitter electrode and a second interface to at least one of the gate electrode or the gate interconnection. A valence band offset at the second interface of the second interlayer dielectric may be larger than the valence band offset at the second interface of the first interlayer dielectric.

For example, the second interlayer dielectric may be or may include an oxide of silicon. The oxide of silicon may include deposited $SiO_2$ and/or thermal $SiO_2$, for example. In addition or as an alternative, the second interlayer dielectric may be or may include a silicate glass, e.g. tetraethyl orthosilicate (TEOS), for example.

For example, a value of the valence band offset at the second interface of the second interlayer dielectric may be by 0.5 eV to 3.0 eV larger than a value of the valence band offset at the second interface of the first interlayer dielectric. Thereby, when exceeding a certain critical temperature, the increasing hole leakage current flow is limited through the first interlayer dielectric.

The examples and features described above and below may be combined.

Some of the above and below examples are described in connection with a silicon carbide substrate. Alternatively, a wide band gap semiconductor substrate, e.g. a wide band gap wafer, may be processed, e.g. comprising a wide band gap semiconductor material different from silicon carbide. The wide band gap semiconductor wafer may have a band gap larger than the band gap of silicon (1.12 eV). For example, the wide band gap semiconductor wafer may be a silicon carbide (SiC) wafer, or gallium arsenide (GaAs) wafer, or a gallium nitride (GaN) wafer.

More details and aspects are mentioned in connection with the examples described above or below. Processing a SiC semiconductor wafer for manufacturing the vertical power semiconductor device may comprise one or more optional additional features corresponding to one or more aspects mentioned in connection with the proposed concept or one or more examples described above or below.

The description and drawings merely illustrate the principles of the disclosure. Furthermore, all examples recited herein are principally intended expressly to be only for illustrative purposes to aid the reader in understanding the principles of the disclosure and the concepts contributed to furthering the art. All statements herein reciting principles, aspects, and examples of the disclosure, as well as specific examples thereof, are intended to encompass equivalents thereof.

In the following, further examples of field effect transistors, FETs, are explained in connection with the accompanying drawings. Functional and structural details described with respect to the examples above shall likewise apply to the exemplary embodiments illustrated in the figures and described further below. In the illustrated examples, n-channel FETs are illustrated. However, the examples described herein may also be applied to p-channel devices, e.g. p-channel MOSFETs or p-channel IGBTs.

Details with respect to structure, or function, or technical benefit of features described above likewise apply to the examples below and vice versa.

FIG. 1 schematically and exemplarily illustrates part of a power semiconductor device 100 configured as a planar or trench gate SiC power MOSFET.

The power semiconductor device 100 includes a first interlayer dielectric 120 comprising a first interface 1221 to the source or emitter electrode 116 and a second interface 1222 to a gate electrode 1061 or a gate pad 112 or a gate interconnection 114 such as a gate runner or gate interconnection line. A schematic band diagram illustrates a conduction band energy Ec versus a direction x/y. A conduction band offset $\Phi_{B,0}$ is present at the first interface 1221. The conduction band offset $\Phi_{B,0}$ may range from 1 eV to 2.5 eV.

Figure 2:
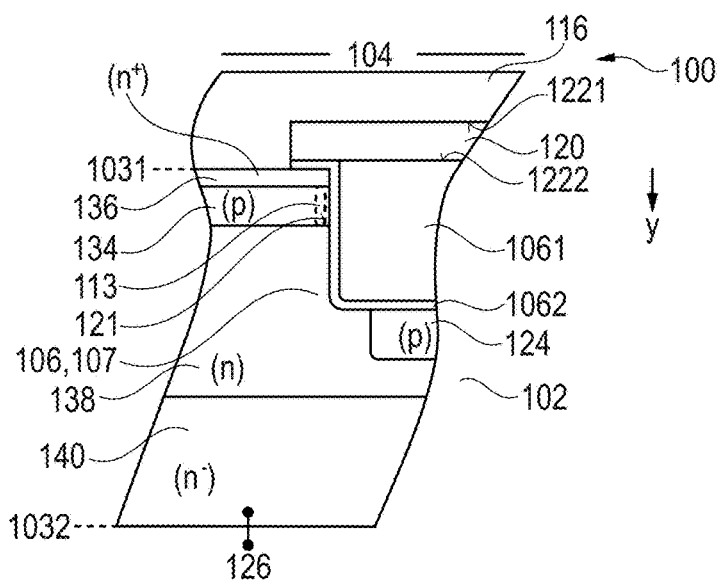
FIG. 2 schematically and exemplarily shows a partial cross-sectional view of a configuration example of a SiC power MOSFET including a trench gate structure.

FIG. 2 schematically and exemplarily shows a partial cross-sectional view of a configuration example of a power semiconductor device 100 configured as a trench gate SiC power MOSFET. The SiC power MOSFET is a vertical power semiconductor device that further includes an edge termination area that at least partially surrounds a transistor cell area 104 (not illustrated in FIG. 2).

A gate structure 106 includes the gate electrode 1061 that is electrically isolated from a SiC semiconductor body 102 by a gate dielectric 1062 of the gate structure 106. The gate dielectric 1062 adjoins to a channel region 113. The channel region 113 is defined by a part of a p-doped body region 134 that adjoins to the gate dielectric 1062 at a channel interface 121 to the gate structure 106. The gate structure 106 is configured as a trench gate structure 107. For example, a conductivity of the channel region 113 may be controlled by a potential applied to the gate electrode 1061, e.g. by field effect. For example, a positive voltage applied to the gate electrode 1061 may induce an n-type inversion channel in the channel region 113 adjoining to the gate dielectric 1062, for example. The p-doped body region 134 may be electrically connected to a source or emitter electrode 116 via the first surface 1031, e.g. by a contact plug of the source or emitter electrode 116 on a top surface of the body region 114 and/or a groove contact that may extend into the SiC semiconductor body 102 and/or may be electrically connected to the body region 134 via a sidewall of a groove contact (not illustrated in FIG. 2). The channel region 113 as part of the body region 134 may include a partial compensation by n-type dopants for adjusting the threshold voltage VTH, for example. The partial compensation may be achieved by a tilted ion implantation through a sidewall of a trench, for example. The gate dielectric 1062 of the gate structure 106 also adjoins to an n$^+$-doped source region 136 that is arranged between the p-doped body region 134 and the first surface 1031.

At a bottom side of the gate structure 106, the gate dielectric 1062 may adjoin to a p-doped diode region 124. The p-doped diode region 124 may include one or a plurality of sub-regions overlapping one another along a vertical direction y. The p-doped diode region 124 may extend up to the first surface 1031 along a sidewall of the trench gate structure 107 that is opposite to sidewall where the channel interface 121 is located (not illustrated in FIG. 2). The gate dielectric 1062 of the gate structure 106 further adjoins to an n-doped current spread region 138 that is arranged between the p-doped body region 134 and an n-doped drift region 140. The n-doped drift region 140 has a smaller doping concentration than the current spread region 138. The drift region 140 is electrically connected to a drain or collector electrode 126 at the second surface 1032 of the SiC semiconductor body 102. Between the drift region 140 and the second surface 1032 further doped semiconductor regions may be arranged, e.g. a highly n-doped drift contact region, or an n-doped field stop region.

The first interlayer dielectric 120 is arranged on top of the gate electrode 1061 with the intermediate second interface 1222. The source or emitter electrode 116 is arranged on top of the first interlayer dielectric 120 with the intermediate first interface 1221. The conduction band offset at the first interface 1221 of the first interlayer dielectric 120 is larger than a conduction band offset at the channel interface 121.

Figures 3A, 3B:
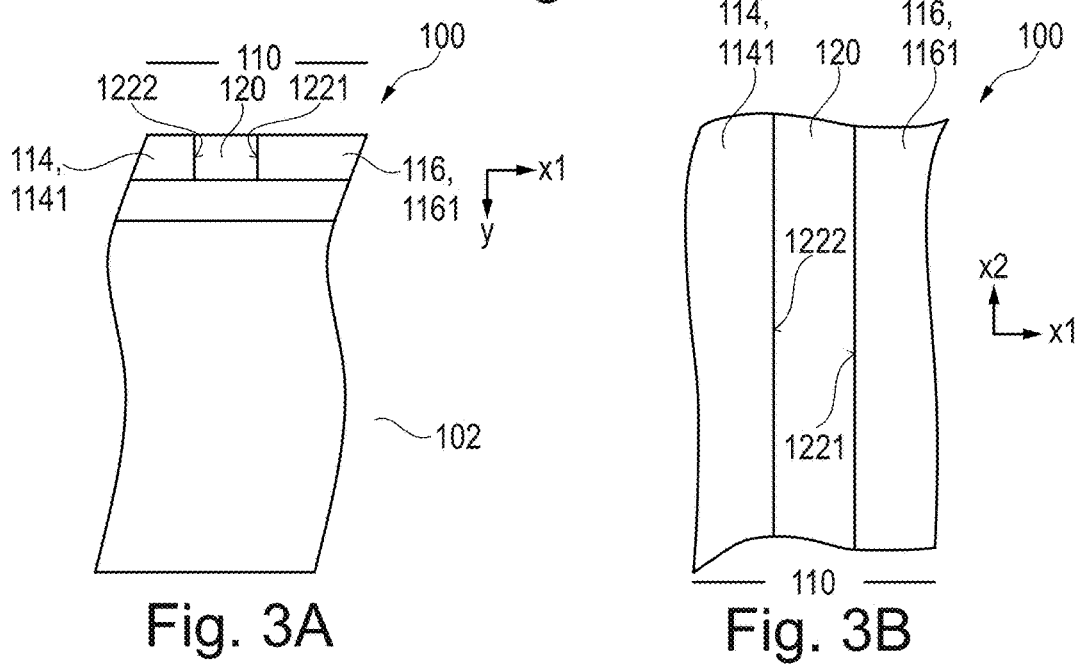
FIGS. 3A and 3B schematically and exemplarily show a partial cross-sectional view and a top view of an interconnection area of a configuration example of a SiC power MOSFET.

The schematic cross-sectional view of FIG. 3A illustrates an interconnection area 110 of a configuration example of a vertical power semiconductor device 100, and FIG. 3B is a top view of FIG. 3A.

Referring to the cross-sectional view of FIG. 3A, the second interface 1222 of the first interlayer dielectric 120 is arranged in the interconnection area 110. The second interface 1222 is arranged directly opposite to the first interface 1221 along a first lateral direction x1. The first interlayer dielectric 120 is arranged laterally between a source or emitter line 1161 of the source or emitter electrode 116 and the gate interconnection 114, e.g. a gate runner 1141.

Referring to the top view of FIG. 3B, the source or emitter line 1161 and the gate runner 1141 extend in parallel along a second lateral direction x2. The second lateral direction x2 may be parallel to an edge of a die comprising the SiC semiconductor body 102 and/or and edge of a transistor cell area, for example.

Figure 4A:
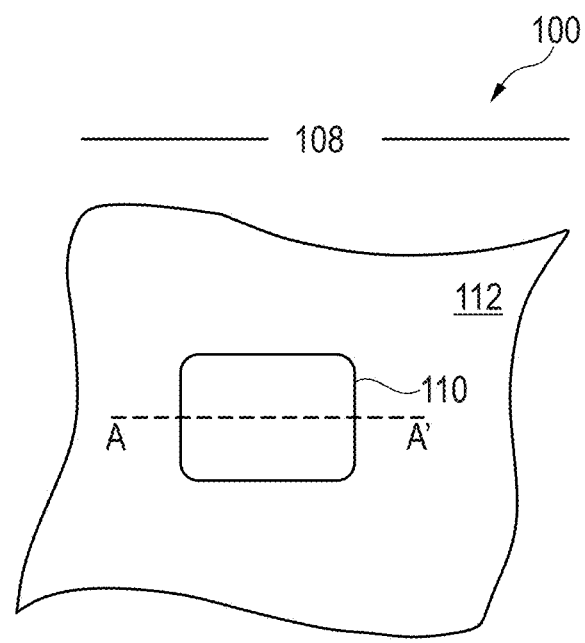
FIGS. 4A and 4B schematically and exemplarily show a top view and a partial cross-sectional view of a gate pad area of a configuration example of a SiC power MOSFET.
Figure 4B:
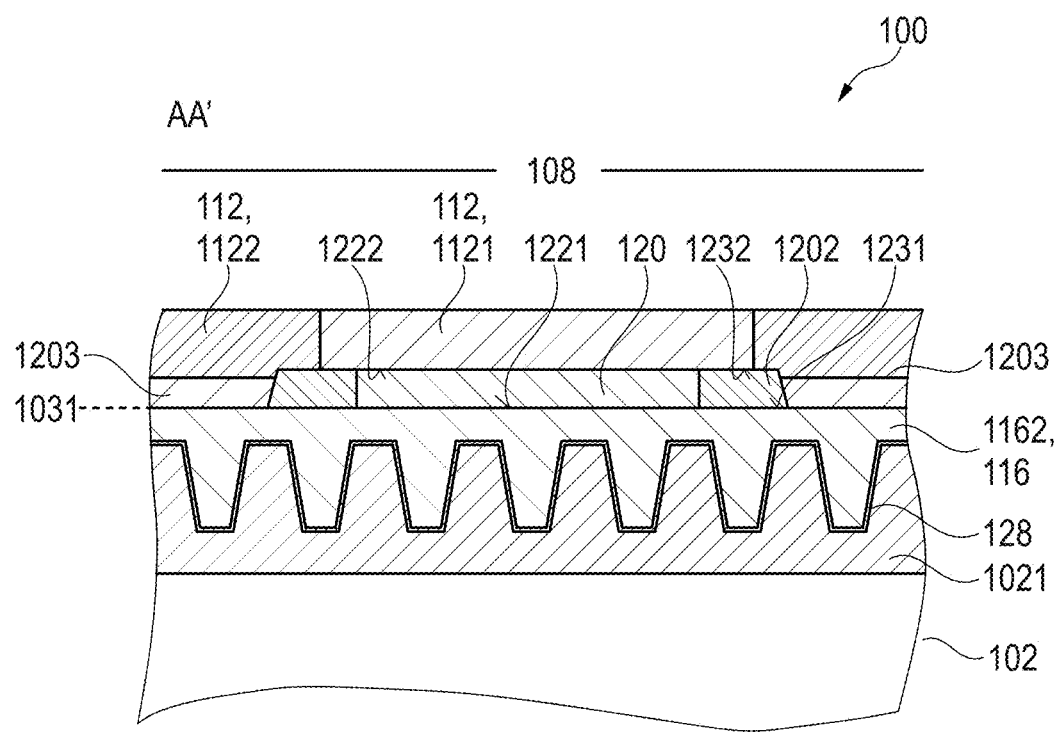

The top view of FIG. 4A illustrates a gate pad area 108 and the schematic cross-sectional view of FIG. 4B is an exemplary view taken along line AA' of FIG. 4A.

A gate pad 112 in the gate pad area 108 includes a first gate pad material 1121, e.g. a first gate metal material, and a second gate pad material 1122. The first interlayer dielectric 120 adjoins to a bottom side of the gate pad 112, i.e. to a bottom side of the first gate pad material 1121, via the second interface 1222. Opposite to the second interface 1222, the first interface 1221 of the first interlayer dielectric 120 adjoins to a source or emitter trench filling material 1162, e.g. doped polycrystalline silicon. The source or emitter trench filling material 1162 is part of the source or emitter electrode 116 and electrically isolated from a doped region 1021, e.g. a p-well, of the SiC semiconductor body 102 via a trench isolation dielectric 128.

The power semiconductor device 100 further includes a second interlayer dielectric 1202 comprising a first interface 1231 to the source or emitter trench filling material 1162 a second interface to the gate pad 112. A conduction band offset at the first interface 1231 of the second interlayer dielectric 1202 is larger than the conduction band offset at the first interface 1221 of the first interlayer dielectric 120. A third interlayer dielectric 1203 on the first surface 1031 of the SiC semiconductor body 102 electrically isolates the gate pad 112 from the SiC semiconductor body and may be further arranged in other areas, e.g. between the gate runner 1141 and/or the source or emitter line 1161 in the interconnection area 110 illustrated in FIGS. 3A, 3B. In some examples, the first gate pad material 1221 may be replaced by the second gate pad material 1222 or vice versa.

Figure 5:
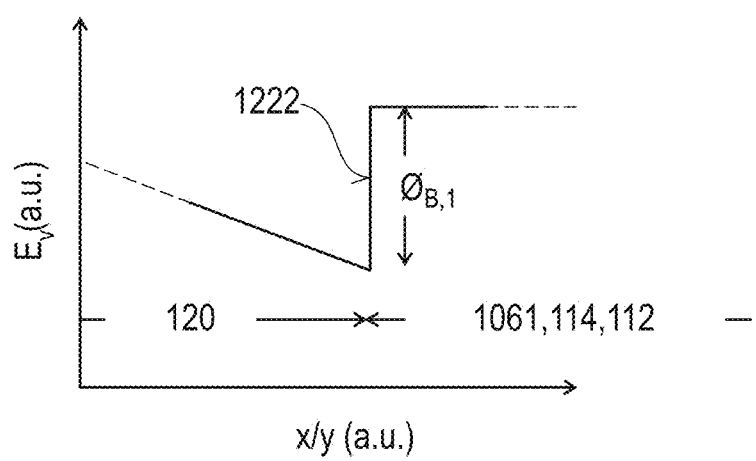
FIG. 5 schematically and exemplarily shows a band diagram of a valence band energy Ev including a second interface between a first interlayer dielectric and one of a gate electrode, or a gate interconnection, or a gate pad.

In examples above, the increasing leakage current between the gate electrode (and/or the gate pad, and/or the gate interconnection) and the source or emitter electrode has been illustrated as an electron current over a conduction band offset $\Phi_{B,0}$ at the first interface 1221 that may lead to a reduction of the gate potential in the transistor cell area, thereby reducing the channel overdrive (gate-to-source voltage VGS minus threshold voltage VTH). Referring to FIG. 5 illustrating a schematic band diagram of a valence band energy Ev versus a direction x/y, a hole leakage current over the second interface 1222 from the gate electrode 1061, or the gate interconnection 114, or the gate pad 112 may also lead to a reduction of the gate potential in the transistor cell area, thereby reducing the channel overdrive (gate-to-source voltage VGS minus threshold voltage VTH). A value of a valence band offset $\Phi_{B,1}$ at the second interface 1222 may range from 1.0 eV to 2.5 eV.

Although specific embodiments have been illustrated and described herein, it will be appreciated by those of ordinary skill in the art that a variety of alternate and/or equivalent implementations may be substituted for the specific embodiments shown and described without departing from the scope of the disclosed subject matter. This application is intended to cover any adaptations or variations of the specific embodiments discussed herein. Therefore, it is intended that the disclosed subject matter be limited only by the claims and the equivalents thereof.

The invention claimed is:

1. A vertical power semiconductor device, comprising:
   a silicon carbide (SiC) semiconductor body having a first surface and a second surface opposite to the first surface, the SiC semiconductor body including a transistor cell area comprising gate structures, a gate pad area, and an interconnection area electrically coupling a gate electrode of the gate structures and a gate pad of the gate pad area via a gate interconnection;
   a source or emitter electrode; and
   a first interlayer dielectric comprising a first interface to the source or emitter electrode and a second interface to at least one of the gate electrode, the gate interconnection, or the gate pad, wherein a value of a conduction band offset at the first interface ranges from 1.0 eV to 2.5 eV.

2. The vertical power semiconductor device of claim 1, wherein a portion of the source or emitter electrode at the first interface comprises at least one of aluminum, copper, titanium, nickel, molybdenum, tungsten, or alloys thereof.

3. The vertical power semiconductor device of claim 1, wherein a portion of the first interlayer dielectric at the first interface comprises a high-k material.

4. The vertical power semiconductor device of claim 3, wherein the high-k material is at least one of an oxide of aluminum, an oxide of zirconium, a nitride of aluminum, an oxide of hafnium, an oxide of yttrium, an oxide of silicon nitride, silicon nitride, or aluminum nitride.

5. The vertical power semiconductor device of claim 1, wherein the gate structures comprise a gate dielectric arranged between the gate electrode and the SiC semiconductor body, and a portion of the gate dielectric at a channel interface to the SiC semiconductor body is a high-k dielectric.

6. The vertical power semiconductor device of claim 1, wherein the conduction band offset at the first interface of the first interlayer dielectric is smaller than a conduction band offset at a channel interface to the SiC semiconductor body.

7. The vertical power semiconductor device of claim 1, wherein the gate structures comprise at least one of planar gate structures or trench gate structures, and at least a part of the second interface is arranged in the transistor cell area, the part of the second interface being directly opposite to the first interface.

8. The vertical power semiconductor device of claim 1, wherein at least a part of the second interface is arranged in the interconnection area, the part of the second interface being directly opposite to the first interface.

9. The vertical power semiconductor device of claim 8, wherein the part of the second interface is arranged directly opposite to a part of the source or emitter electrode having two edges a bottom side that turn into one another at an angle equal to or smaller than 90°.

10. The vertical power semiconductor device of claim 1, wherein at least a part of the second interface of the first interlayer dielectric is arranged in the interconnection area, the part of the second interface being directly opposite to the first interface along a first lateral direction, wherein a part of the first interlayer dielectric is arranged laterally between a source or emitter line of the source or emitter electrode and the gate interconnection.

11. The vertical power semiconductor device of claim 1, wherein the gate interconnection includes a gate resistor having a gate resistance in the range from 5Ω to 20 Ω.

12. The vertical power semiconductor device of claim 1, further comprising a second interlayer dielectric comprising a first interface to the source or emitter electrode and a second interface to at least one of the gate electrode, the gate interconnection, or the gate pad, and wherein a conduction band offset at the first interface of the second interlayer dielectric is larger than the conduction band offset at the first interface of the first interlayer dielectric.

13. The vertical power semiconductor device of claim 12, wherein the second interlayer dielectric comprises an oxide of silicon.

14. The vertical power semiconductor device of claim 12, wherein the conduction band offset at the first interface of the second interlayer dielectric is by 0.5 eV to 1.5 eV larger than the conduction band offset at the first interface of the first interlayer dielectric.

15. A vertical power semiconductor device, comprising:
   a silicon carbide (SiC) semiconductor body having a first surface and a second surface opposite to the first surface, the SiC semiconductor body including a transistor cell area comprising gate structures, a gate pad area, and an interconnection area electrically coupling a gate electrode of the gate structures and a gate pad of the gate pad area via a gate interconnection;
   a source or emitter electrode; and
   a first interlayer dielectric comprising a first interface to the source or emitter electrode and a second interface to at least one of the gate electrode, the gate interconnection, or the gate pad, wherein a value of a valence band offset at the second interface ranges from 1.0 eV to 2.5 eV.

16. The vertical power semiconductor device of claim 15, further comprising a second interlayer dielectric comprising a first interface to the source or emitter electrode and a second interface to at least one of the gate electrode, the gate interconnection, or the gate pad, wherein a valence band offset at the second interface of the second interlayer dielectric is larger than the valence band offset at the second interface of the first interlayer dielectric.

17. The vertical power semiconductor device of claim 16, wherein the second interlayer dielectric comprises an oxide of silicon.

18. The vertical power semiconductor device of claim 16, wherein a value of the valence band offset at the second interface of the second interlayer dielectric is by 0.5 eV to 3.0 eV larger than a value of the valence band offset at the second interface of the first interlayer dielectric.

* * * * *